United States Patent

Furuya et al.

[11] Patent Number: 6,161,886
[45] Date of Patent: Dec. 19, 2000

[54] COMPONENT MOUNTING HEAD

[75] Inventors: Hiroshi Furuya; Kanji Uchida; Kazuhiko Narikiyo, all of Yamanashi; Osamu Okuda, Hirakata, all of Japan

[73] Assignee: Matsushita Electric Industrial Co., Ltd., Osaka, Japan

[21] Appl. No.: 09/202,620

[22] PCT Filed: Jun. 24, 1997

[86] PCT No.: PCT/JP97/02161

§ 371 Date: Dec. 18, 1998

§ 102(e) Date: Dec. 18, 1998

[87] PCT Pub. No.: WO97/50285

PCT Pub. Date: Dec. 31, 1997

[30] Foreign Application Priority Data

Jun. 26, 1996 [JP] Japan .................................. 8-165877

[51] Int. Cl.⁷ .............................. B25J 15/06; B65G 47/91
[52] U.S. Cl. ............................................ 294/64.1; 29/743
[58] Field of Search ........................ 294/2, 64.1; 29/740, 29/743; 279/3; 414/627, 737, 752, 935, 937, 941; 901/40

[56] References Cited

U.S. PATENT DOCUMENTS

| | | | |
|---|---|---|---|
| 3,921,971 | 11/1975 | Vollrath | 294/64.1 X |
| 4,703,965 | 11/1987 | Lee et al. | 294/64.1 |
| 4,705,311 | 11/1987 | Ragard | 294/64.1 X |
| 4,729,713 | 3/1988 | Takaichi et al. | 294/2 X |
| 4,860,438 | 8/1989 | Chen | 29/743 X |
| 4,950,011 | 8/1990 | Borcea et al. | 294/2 |
| 5,755,471 | 5/1998 | Bjorklund et al. | 294/64.1 |

FOREIGN PATENT DOCUMENTS

| | | |
|---|---|---|
| 0 253 228 | 1/1988 | European Pat. Off. . |
| 0 401 808 | 12/1990 | European Pat. Off. . |
| 40 34 422 | 5/1991 | Germany . |
| 2-174299 | 7/1990 | Japan . |

Primary Examiner—Johnny D. Cherry
Attorney, Agent, or Firm—Wenderoth, Lind & Ponack, L.L.P.

[57] ABSTRACT

A buffer member is installed so as not to rotate around an axis relative to a vacuum rod. An engaging part is provided at one end of the buffer member, and an engaging part to be engaged with the engaging part is provided at a rear end of a nozzle member. The nozzle member is prevented from rotating around the axis through the engagement of the engaging parts.

8 Claims, 5 Drawing Sheets

COMPONENT MOUNTING HEAD

TECHNICAL FIELD

The present invention relates to a component mounting head to which nozzle members for holding, e.g., electronic components to be mounted to circuit boards are freely attached/detached.

BACKGROUND ART

A conventional component mounting head will be described with reference to the drawings.

FIG. 8 shows a perspective view of the whole of a mounting apparatus. Nozzle members 2 for holding with suction electronic components to be mounted to circuit boards are attached at a front end part of a component mounting head 1. Each nozzle member 2 can be attached/detached to the component mounting head 1 in a one-touch operation. A nozzle station 3 provides nozzle members 2 in conformity with components to be mounted.

As mentioned above, while the nozzle members 2 can be freely attached/detached to the component mounting head 1, for this free attachment/detachment, three types (1)—(3) of component mounting head 1 have been proposed.

The structure of a mounting head and a nozzle member in a prior example (1) will be first described with reference to FIGS. 4 and 5.

In FIG. 4, a fitting part 4a of a nozzle member 4 is formed cylindrical and having an air path 11 thereinside. The fitting part 4a is detachably fitted at a front end part in a vacuum rod 5 along an axial direction of the vacuum rod 5. The nozzle member 4 fitted in the vacuum rod 5 is urged downward in the drawing by an urging force of a compression spring 17 stored in parallel to the axial direction in the vacuum rod 5 via a pusher 10. As indicated in FIG. 4, both a contact face 10a of the pusher 10 and a contact face 4b of the fitting part 4a are planar, so that the pusher 10 and fitting part 4a are held in facing contact with each other. The air path 11 is formed in the vacuum rod 5 and fitting part 4a to introduce the air of a negative pressure. A plug 407 is press-fitted at the contact face 4b to shut a hole used when the air path 11 is provided in the fitting part 4a.

The nozzle member 4 urged downward as in the drawing is retained in the vacuum rod 5 by a structure described below. Recess parts 401a, 401b of a suitable length are formed in an axial direction of the nozzle member 4 in an outer circumferential surface of the fitting part 4a. The recessed parts are separated approximately 180° in the circumferential direction of the fitting part 4a. Steel balls 12a, 12b are pressed into the recessed parts 401a, 401b by means of compression springs 13a, 13b exerting an urging force in a direction orthogonal to the axial direction of the nozzle member 4. As shown in FIG. 5, when the steel ball 12a pressed into the recessed part 401a by the compression spring 13a contacts a side wall 403 of the recessed part 401a, a circumferentially rotational force in a counterclockwise direction is applied to the nozzle member 4. Meanwhile, when the steel ball 12b is pressed against a bottom face 402 of the recessed part 401b by the urging force of the compression spring 13b, the circumferential rotation of the nozzle member 4 by the above-described rotational force is restricted. In this construction, the nozzle member 4 is prevented from rotating in the circumferential direction unexpectedly. Moreover, since the steel balls 12a, 12b contact axial end parts 404, 404 of the recessed parts 401a, 401b, the nozzle member 4 is restricted from moving downward in the drawing and is maintained in the vacuum rod 5.

The structure of a mounting head and a nozzle member in a prior example (2) will be discussed with reference to FIG. 6.

A fitting part 14a of a nozzle member 14 is formed cylindrical, with an air path 11 formed thereinside. The fitting part 14a is fitted detachably at a front end part in a vacuum rod 15 along an axial direction of the vacuum rod 15. A torsion coil spring 19 is stored along the axial direction in the vacuum rod 15 so as to urge the nozzle member 14 in a circumferential direction of the nozzle member 14. A cylindrical shank 18 is set along the axial direction in the vacuum rod 15 between the torsion coil spring 19 and nozzle member 14. A rotational force in the circumferential direction by the torsion coil spring 19 is transmitted via the shank 18 to the nozzle member 14. At a part of the nozzle member 14 which contacts the shank 18, the nozzle member 14 projects conically and the shank 18 is recessed like a mortar, as indicated in the drawing. The nozzle member 14 and shank 18 are accordingly kept in facing contact with each other.

A recessed part 40 is formed in an outer circumferential surface of the shank 18 over a predetermined distance along the axial direction. A pin 20 is inserted from an outer face of the vacuum rod 15 into the recessed part 40 and engaged with the recessed part 40, whereby the shank 18 is restricted against rotation in the circumferential direction. A recessed part 405 is also formed over the entire circumference of the fitting part 14a at a part of the outer circumferential face of the fitting part 14a. A steel ball 16 is fitted in a through-hole 406 formed in the vacuum rod 15, which is urged by an elastic body 17 in a direction orthogonal to the axial direction of the nozzle member 14. When the steel ball 16 is meshed with the recessed part 405, the fitting part 14a is controlled to not move in the axial direction of the vacuum rod 15. The structure of the example (2) is disclosed, for example, in Examined Japanese Patent Publication No. 7-24357 and Unexamined Japanese Laid-Open Patent Publication No. 4-133400.

Now, the structure of a mounting head and a nozzle member in a prior example (3) will be discussed with reference to FIG. 7. The structure shown in FIG. 7 is approximately equivalent to the structure of FIG. 6 and therefore only a difference therebetween will be depicted here. The same component members as those of FIG. 6 are designated by the same reference numerals in FIG. 7.

In the structure of FIG. 7, a compression spring 21 is installed in place of the torsion coil spring 19. The nozzle member 14 is urged downward by the compression spring 21.

Structures of the examples (1)–(3) have drawbacks which will be described below.

Specifically, in the mounting head of the example (1) of the structure in FIGS. 4 and 5, the force restricting the rotation of the nozzle member 4 in the circumferential direction depends on the balance of elasticities of the compression springs 13a, 13b, and therefore is unstable. Mounting accuracy for electronic components is disadvantageously reduced. On the other hand, if the urging forces of the compression springs 13a, 13b are increased to enlarge the strength to restrict the rotation of the nozzle member 4, it becomes difficult for the steel balls 12a, 12b to retreat outwardly from the recessed parts 401a, 401b, whereby the nozzle member 4 cannot be attached/detached easily to the mounting head in the simple one-touch operation, or it is diificult for the nozzle member 4 hard to slide in the axial direction.

In the structure of the example (2) in FIG. 6, the torsion coil spring 19 and shank 18 are used to urge the nozzle member 14 in the circumferential direction to thereby restrict the unexpected rotation of the nozzle member 14 in the circumferential direction. However, if the torsional force of the torsion coil spring 19 is weak, the nozzle member 14 readily rotates in the circumferential direction, thereby decreasing the accuracy for mounting of the electronic components. In contrast, if the torsional force of the torsion coil spring 19 is too strong, too much friction force acts between the recess part 40 of the shank 18 and the pin 20 and, and it becomes difficult to slide the nozzle member 14 in the axial direction.

In addition, it is easy for an error to occur during assembly, in that the torsion coil spring 19 may be installed in the vacuum rod 15 without being twisted.

In the structure of the example (3) of FIG. 7, since the nozzle member 14 is not urged in the circumferential direction, the recessed part 40 of the shank 18 is not held in tight contact with the pin 20; in other words, the nozzle member 14 may accidentally rotates in the circumferential direction.

DISCLOSURE OF INVENTION

The present invention is devised to solve the above-described drawbacks and has for its object to provide a component mounting head capable of mounting a component to a mounting position with high mounting accuracy.

In accomplishing these and other objects, according to a first aspect of the present invention, there is provided a component mounting head comprising: a nozzle fitting part; a buffer member installed so as not to rotate around an axis thereof relative to the nozzle fitting part and having a first engaging part at one end thereof; and a nozzle member inserted and fitted detachably to the nozzle fitting part via the buffer member, movable in an axial direction thereof, adapted to draw a component by suction at a front end thereof, and having, at rear end thereof, a second engaging part to be engaged with the engaging part of the buffer member, whereby the nozzle member is prevented from rotating around the axis thereof through engagement of the first and second engaging parts.

According to a second aspect of the present invention, there is provided a component mounting head according to the first aspect, wherein the first engaging part is a projecting part having a linear engaging edge in line contact with the second engaging part, and the second engaging part is a recessed part having an engaging face in line contact with the engaging edge.

According to a third aspect of the present invention, there is provided a component mounting head according to the second aspect, wherein the projecting part as the first engaging part has a rectangular cross section, while the recessed part as the second engaging part has a V-shaped cross section.

According to a fourth aspect of the present invention, there is provided a component mounting head according to any of the first to third aspects, wherein the buffer member has an urging member normally urging the first engaging part toward the second engaging part, while the nozzle fitting part has a separation restraint member for restricting the nozzle member from being detached from the nozzle fitting part by an urging force of the urging member.

According to a fifth aspect of the present invention, there is provided a component mounting head according to the fourth aspect, wherein the buffer member further has an outer cylinder tightly fitted so as not to rotate around the axial direction insert to the nozzle fitting part and a spline shaft set in the outer cylinder on the same axis as the nozzle member to be movable in the axial direction and urged to a side of the nozzle member by the urging member.

According to a sixth aspect of the present invention, there is provided a component mounting head according to the fifth aspect, wherein a sliding member is provided at a part where the outer cylinder touches the spline shaft to let the spline shaft smoothly move in the axial direction.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
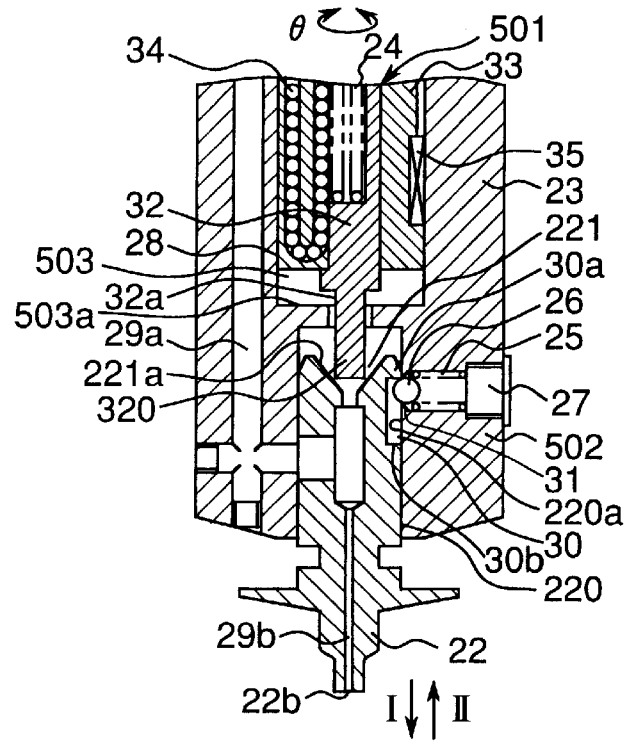
FIG. 1 is a sectional view showing a structure in the vicinity of a nozzle member of a component mounting head in one embodiment of the present invention.

Before the description of the present invention proceeds, it is to be noted that like parts are designated by like reference numerals throughout the accompanying drawings.

A component mounting head in one embodiment of the present invention will be described with reference to the drawings. A vacuum rod 23 serves as one example of a nozzle fitting part of this aspect of the invention, and a member with a spline shaft 32, an outer cylinder 33, a compression spring 24 and a sliding member 28 serves as one example of a buffer member. At the same time, a member with a compression spring 25, a steel ball 26, and a bolt 27 serves as one example of a separation restraint member.

Figure 4:
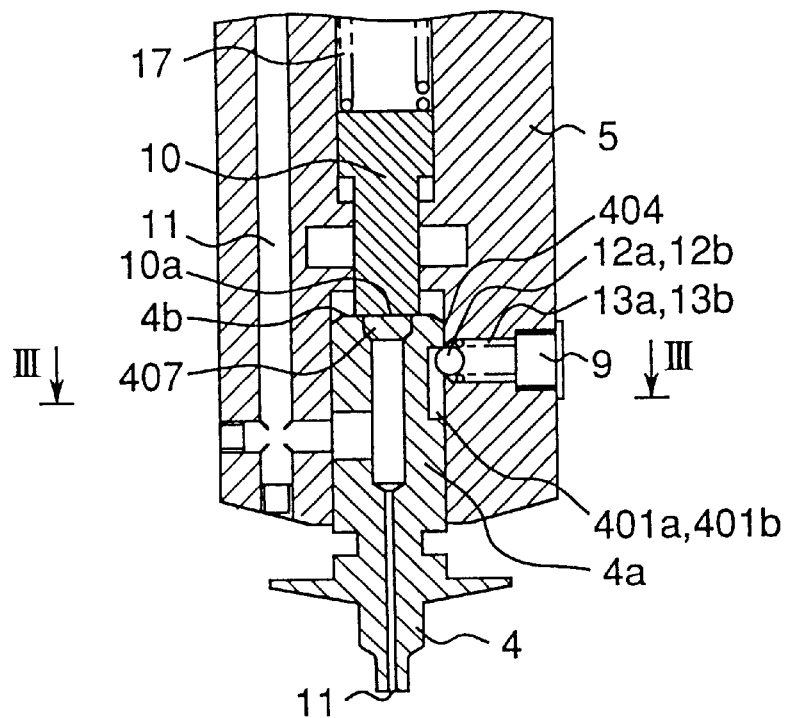
FIG. 4 is a sectional view showing a structure in the vicinity of a nozzle member of a conventional component mounting head.
Figure 5:
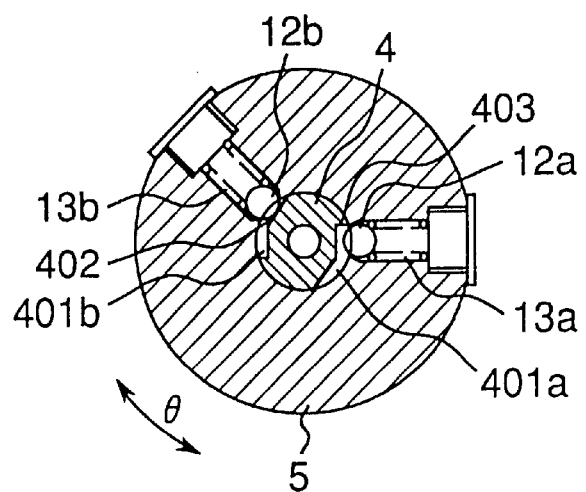
FIG. 5 is a sectional view of the component mounting head along the line III—III of FIG. 4.
Figure 6:
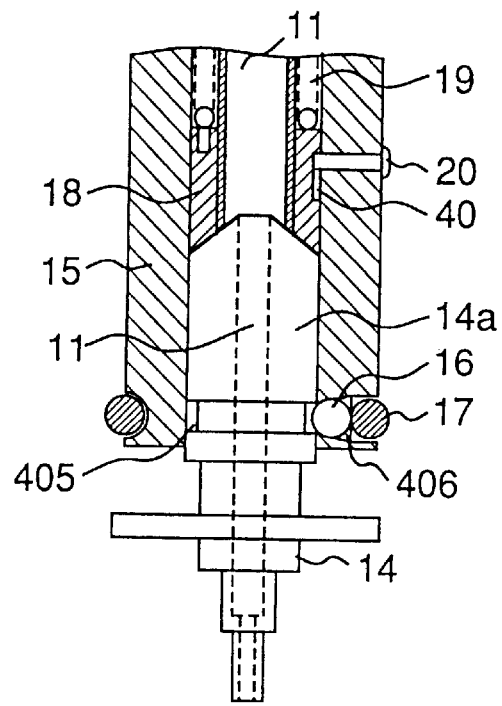
FIG. 6 is a sectional view of a structure in the vicinity of a nozzle member of a different conventional component mounting head.
Figure 7:
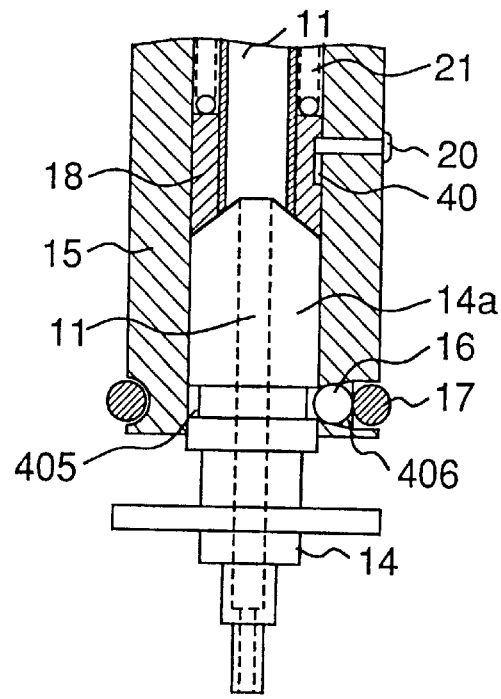
FIG. 7 is a sectional view of a structure in the vicinity of a nozzle member in yet another conventional component mounting head.
Figure 8:
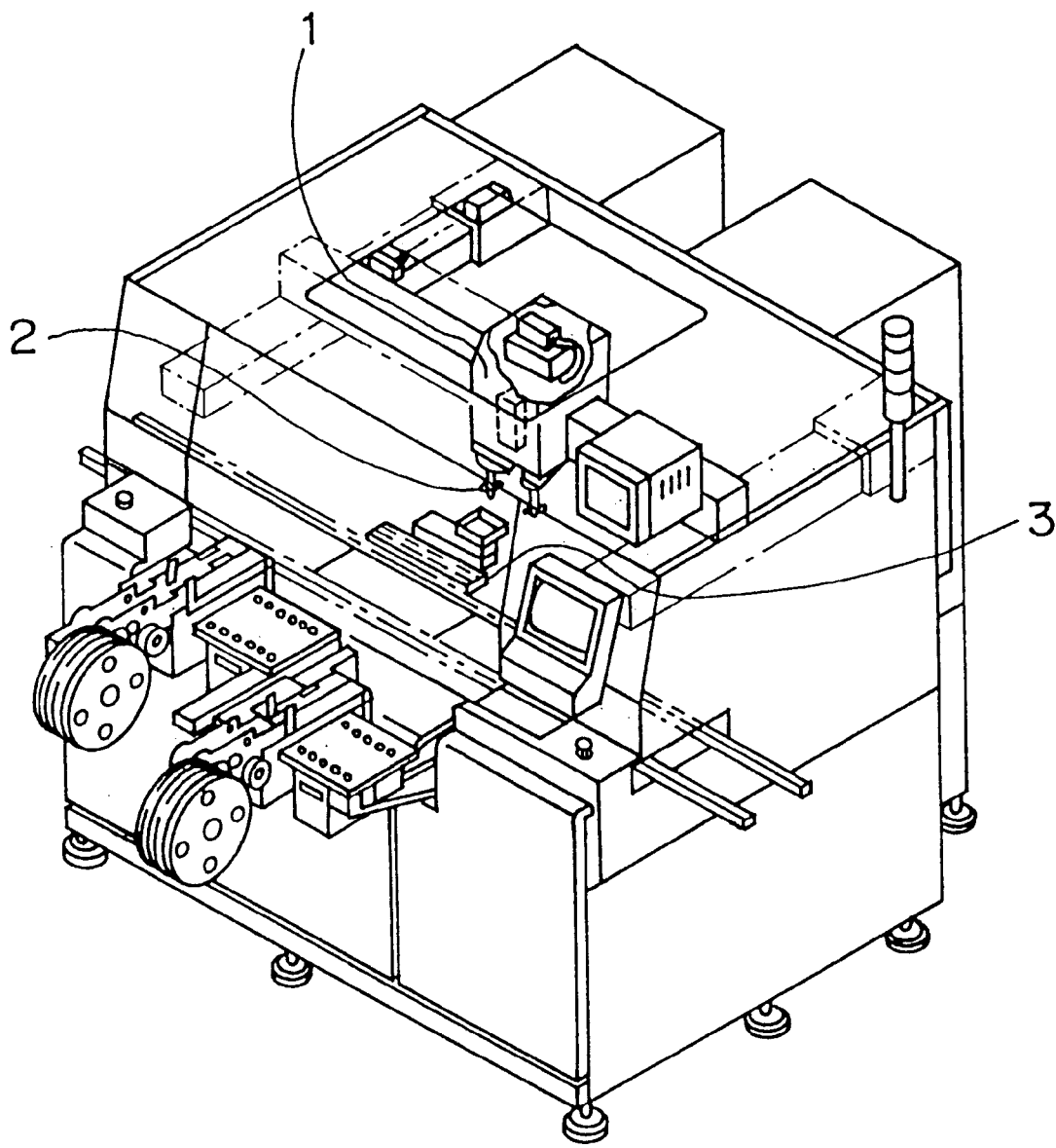
FIG. 8 is a perspective view of a whole mounting machine.

The vacuum rod 23 which is a member corresponding to, e.g, the vacuum rod 5 described with reference to FIG. 4 and coincides with a front end part of the mounting head is provided with the buffer member 501 referred to above and a nozzle member 22 on the same axis. The buffer member 501 set inside the vacuum rod 23, and the nozzle member 22 set at one end part 502 of the vacuum rod 23 will be described more in detail with reference to FIG. 1.

The buffer member 501 will be described first. As mentioned earlier, the buffer member 501 is constituted by the spline shaft 32, outer cylinder 33, compression spring 24, and sliding member 28.

A fitting hole 503 for the buffer member is formed inside the vacuum rod 23 in the axial direction, as shown in FIG. 1. An insertion hole 220 is formed at the one end part 502 of the vacuum rod 23 on the same axis as the fitting hole 503 but below the fitting hole 503. The nozzle member 22 to be described later is inserted slidably into the insertion hole 220.

In the fitting hole 503 is fitted the buffer member 501 so as not to rotate around the axial direction (θ direction indicated in the drawing) relative the vacuum rod 23. The buffer member 501 adopts a so-called ball spline constructed by the spline shaft 32, outer cylinder 33, and sliding member 28 having a plurality of steel balls 34 arranged radially, wherein the spline shaft 32 slides in the axial direction via the steel balls 34. A pre-load is impressed so as not to generate the so-called play in the sliding motion of the spline shaft 32 and outer cylinder 33. Moreover, a key 35 is press-fitted so as not to loosen the outer cylinder 33 and vacuum rod 23 around the axial direction (the above θ direction). The outer cylinder 33 and spline shaft 32 are thus not allowed to rotate around the axis (the above θ direction) relative to the vacuum rod 23.

Meanwhile, due to the sliding member 28, the spline shaft 32 is smoothly movable in the axial direction relative to the outer cylinder 33 and urged to the side of the nozzle member 22 by the urging force of the compression spring 24. Since the spline shaft 32 contacts an end face 503a of the fitting hole 503, the spline shaft 32 is prevented from moving towards the nozzle member 22 more than required.

A shaft part 32a is formed at one end of the spline shaft 32, extending through an opening formed in the end face 503a to the nozzle member 22. A front end part of the shaft part 32a constitutes an engaging part 320. The engaging part 320 in the embodiment is shaped as a quadrilateral having a rectangular cross section as is clearly shown in FIG. 3. A linear engaging edge 321 is formed on the engaging part 320. The engaging edge 321 comes in line contact with engaging faces 221a of an engaging part 221 of the nozzle member 22 as will be described later.

The nozzle member 22 will now be described.

As mentioned above, the insertion hole 220 of a circular lateral cross section is formed to a predetermined depth at one end part 502 of the vacuum rod 23 in the axial direction of the vacuum rod 23. The nozzle member 22 is slidably fitted in the insertion hole 220.

The nozzle member 22 is in the shape of a column, and a negative pressure air path 29b is formed inside the nozzle member 22 generally in the axial direction. An air path 29a is also formed in the vacuum rod 23. While the nozzle member 22 is fitted in the insertion hole 220, when the steel ball 26 advances into a recessed part 30 as described later, the air path 29a communicates with the air path 29b. As a result, an electronic component can be held by suction at an opening 22b of the air path 29b at a front end of the nozzle member 22.

Figure 3:
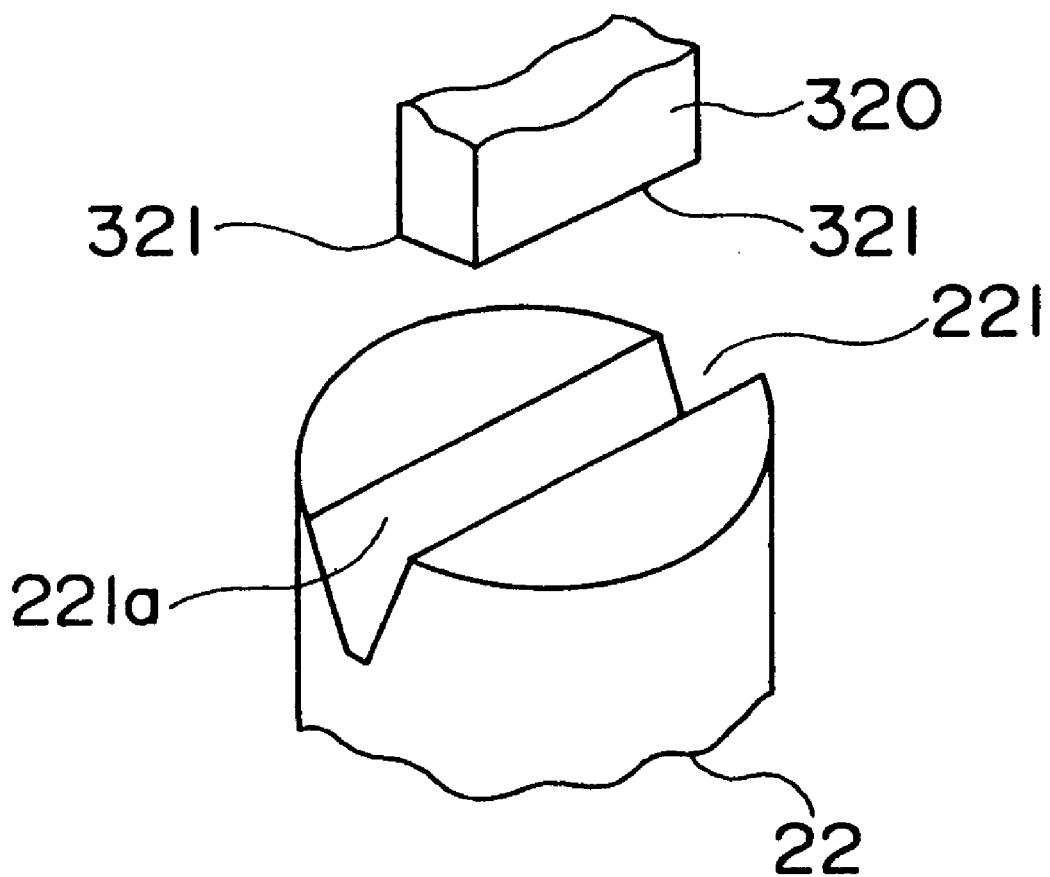
FIG. 3 is a perspective view schematically showing shapes of an engaging part of a spline shaft and an engaging part of the nozzle member of FIG. 1.

A V-shaped groove serving as the engaging part 221 to be engaged with the engaging part 320 of the above-described spline shaft 32 is notched at a rear end of the nozzle member 22. The V-shaped engaging part 221 is a V-shaped groove defined by two engaging faces 221a, 221a extending in a diametrical direction of the columnar nozzle member 22, as schematically shown in FIG. 3. The engaging faces 221a are brought into line contact with the engaging edges 321 of the engaging part 320.

The recessed part 30 of a predetermined length is formed in the axial direction at a part of an outer circumferential face of the rear end part of the nozzle member 22. On the other hand, a taper hole 31 is formed at an inner circumferential face 220a of the insertion hole 220, to which a part of a spherical face of the steel ball 26 urged by the compression spring 25 projects in a direction orthogonal to the axial direction of the vacuum rod 23. In a state in which the nozzle member 22 is inserted and fitted in the insertion hole 220, the projecting steel ball 26 plunges into the recessed part 30. The compression spring 25 is prevented from slipping out by means of a bolt 27 screwed from outside of the vacuum rod 23.

When the steel ball 26 plunges into the recessed part 30 as described above, the nozzle member 22 becomes slidable in the axial direction in the insertion hole 220 in a range of the recessed part 30 during the component mounting operation. In other words, the movement of the nozzle member 22 in a direction of an arrow I is restricted because the spherical face of the steel ball 26 contacts a wall face 30a of a rear end of the recessed part 30, and at the same time, the movement of the nozzle member 22 in a direction of an arrow II is restricted because the spherical face of the steel ball 26 contacts a wall face 30b at a front end of the recessed part 30.

Further, since the spline shaft 32 is urged toward the nozzle member 22 by the compression spring 24, in a state where the steel ball 26 plunges into the recessed part 30 to thereby hold the nozzle member 22 in the insertion hole 220, the engaging part 320 of the spline shaft 32 is pressed into contact with the engaging part 221 of the nozzle member 22. The engaging part 320 of the spline shaft 32 is accordingly engaged with the engaging part 221 of the nozzle member 22. More specifically, the engaging edges 321 of the engaging part 320 of the spline shaft 32 are in line contact with the engaging faces 221a of the engaging part 221 of the nozzle member 22, whereby the spline shaft 32 is restrained from rotating around the axis as described before. In consequence, the nozzle member 22 is prevented from rotating around the axis in the engaged state of the engaging part 221 of the nozzle member 22 with the engaging part 320 of the spline shaft 32. The nozzle member 22 is hence perfectly circumferentially positioned and can mount the electronic component to a circuit board with high mounting accuracy.

Although the engaging part 320 in the embodiment is rectangular as shown in FIG. 3, the shape is not limited to this. For instance, the engaging part 320 may have a cross section coincident with the V-shaped cross section of the engaging part 221 as in FIG. 2. That is, the engaging part 320 and engaging part 221 can be formed in any shape so long as no circumferential play is generated when both parts 320, 221 are engaged with each other.

The operation of a component mounting head equipped with the buffer member 501 and nozzle member 22 constituted as above will be discussed below.

Similar to the operation of the conventional component mounting head, the component mounting head holds an electronic component at the opening 22b at the front end of the nozzle member 22 by suction, moves the electronic component to a mounting position of the circuit board and releases the suction of the electronic component when the electronic component is mounted to the circuit board. The nozzle member 22 buffers an impact applied to the electronic component when the electronic component is drawn by suction and released from the suction, by the advancing and retreating of the nozzle member 22 due to the action of the compression spring 24 against the spline shaft 32 and the compression spring 25 against the steel ball 26.

While the steel ball 26 projects into the recessed part 30 and consequently the nozzle member 22 is inserted in the insertion hole 220 of the vacuum rod 23, as shown in FIG. 1, the engaging part 320 of the spline shaft 32 is pressed against the engaging part 221 of the nozzle member 22 by the urging force of the compression spring 24 and then, is engaged with the engaging part 221. As described earlier, when the engaging part 320 is engaged with the engaging part 221, the nozzle member 22 is brought into a state in which it will not rotate around the axis.

Since the nozzle member 22 is perfectly circumferentially positioned as described above, the electronic component can be mounted to the circuit board with high accuracy.

Figure 2:
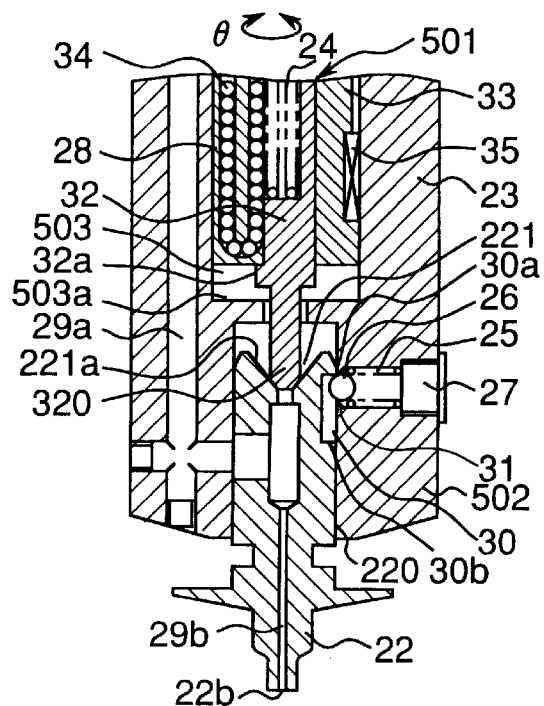
FIG. 2 is a sectional view showing a structure in the vicinity of a nozzle member of a component mounting head in another embodiment of the present invention.

When the nozzle member 22 is inserted into the insertion hole 220, a position in the axial direction of the nozzle member 22 is determined by a relation of the urging force of the compression spring 24 urging the spline shaft 32 toward the nozzle member 22 and the urging force of the compression spring 25 urging the steel ball 26 toward the recessed part 30. FIGS. 1 and 2 represent a state wherein the nozzle member 22 is disposed at a position where the steel ball 26 contacts the rear end-wall face 30a of the recessed part 30.

How to exchange the nozzle member 22 will be explained.

In order to detach the nozzle member 22 from the vacuum rod 23, the spherical face of the steel ball 26 is brought into contact with the wall face 30a of the rear end of the recessed part 30, and the nozzle member 22 is firmly pulled in the I direction. As a result of this, the steel ball 26 is pressed into the vacuum rod 23 against the urging force of the compression spring 25, i.e., the engaged state of the steel ball 26 with the recessed part 30 is released. Accordingly, the nozzle member 22 can be detached easily from the vacuum rod 23.

In order to fix another nozzle member 22-1 to the vacuum rod 23, a position of the steel ball 26 is set to agree with a position of the recessed part 30 of the new nozzle member 22-1 to be attached, and the nozzle member 22-1 is inserted into the insertion hole 220 by pressing the steel ball 26 into the vacuum rod 23. The steel ball 26 then moves into the recessed part 30 and the nozzle member 22-1 is fitted to the vacuum rod 23, and the nozzle member 22-1 is prevented from rotating around the axis, similar to the above-described case of the nozzle member 22.

Since the nozzle member 22 is held in the insertion hole 220 by the engagement between the steel ball 26 and recessed part 30, the nozzle member can be exchanged with ease simply by moving the nozzle member 22 in the axial direction of the insertion hole 220.

In the foregoing embodiment, the key 35 is used as a fixing member for fixing the outer cylinder 33 of the buffer member 501 to the vacuum rod 23. A set screw or the like means may be employed instead.

Alternatively, the outer cylinder 33 of the buffer member 501 and the vacuum rod 23 may be formed in one body, to thereby eliminate the key 35.

According to the embodiment, electronic components are chosen as an example of components to be held by the nozzle member 22 and mounted to the circuit board but the components are not limited to electronic components. Likewise, a member to which the components are mounted is naturally not limited to the circuit board.

As is fully described hereinabove, according to the present invention, the buffer member is installed in a manner so as not to rotate around the axis relative to the nozzle fitting part. Moreover, the engaging part is provided at one end of the buffer member and the engaging part to be engaged with the above engaging part is provided at the rear end of the nozzle member. The nozzle member is thus prevented from rotating around the axis through the engagement of the two engaging parts of the buffer member and the nozzle member, and accordingly the nozzle member is perfectly circumferentially positioned. Components can be mounted with high mounting accuracy.

The entire disclosure of Japanese Patent Application No. 8-165877 filed on Jun. 26, 1996, including specification, claims, drawings, and summary, is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting head comprising:
   a nozzle fitting part provided with a buffer member having a first engaging part at one end; and
   a nozzle member inserted in and detachably fitted to said nozzle fitting part for drawing a component by suction at a front end thereof, said nozzle member being movable in an axial direction relative to said nozzle fitting part and having a second engaging part to be engaged with the first engaging part of the buffer member at a rear end thereof,
   characterized in that said buffer member is installed so as not to rotate around an axis with respect to the nozzle fitting part, and that the first and second engaging parts are arranged in such a way that the nozzle member is prevented from rotating around an axis relative to said nozzle fitting part.

2. A component mounting head according to claim 1, wherein the first engaging part is a projecting part having a linear engaging edge in line contact with the second engaging part and the second engaging part is a recessed part having an engaging face in line contact with the engaging edge.

3. A component mounting head according to claim 2, wherein the projecting part as the first engaging part has a rectangular cross section, while the recessed part as the second engaging part has a V-shaped cross section.

4. A component mounting head according to claim 3, wherein the buffer member has an urging member normally urging the first engaging part toward the second engaging part while the nozzle fitting part has a separation restraint member for restricting the nozzle member from being detached from the nozzle fitting part by an urging force of the urging member.

5. A component mounting head according to claim 2, wherein the buffer member has an urging member normally urging the first engaging part toward the second engaging part while the nozzle fitting part has a separation restraint member for restricting the nozzle member from being detached from the nozzle fitting part by an urging force of the urging member.

6. A component mounting head according to claim 1, wherein the buffer member has an urging member normally urging the first engaging part to the second engaging part, while the nozzle fitting part has a separation restraint member for restricting the nozzle member from being detached from the nozzle fitting part by an urging force of the urging member.

7. A component mounting head according to claim 6, wherein the buffer member further has an outer cylinder tightly fitted so as not to rotate relative to the nozzle fitting part, and a spline shaft set in the outer cylinder on the same axis as the nozzle member to be movable in the axial direction and urged toward the nozzle member by the urging member.

8. A component mounting head according to claim 7, wherein a sliding member is provided at a part where the outer cylinder touches the spline shaft to let the spline shaft smoothly move in the axial direction.

* * * * *